(12) United States Patent
Brossier et al.

(10) Patent No.: US 7,660,378 B2
(45) Date of Patent: Feb. 9, 2010

(54) PHASE ESTIMATION METHOD IN A DIGITAL AND PHASE LOCKED LOOP COMMUNICATION SYSTEM

(75) Inventors: Jean-Marc Brossier, Saint Martin d'Heres (FR); Frédéric Lehmann, San Diego, CA (US)

(73) Assignee: ST Microelectronics SA, Montrouge (FR)

( * ) Notice: Subject to any disclaimer, the term of this patent is extended or adjusted under 35 U.S.C. 154(b) by 662 days.

(21) Appl. No.: 10/531,674

(22) PCT Filed: Oct. 17, 2003

(86) PCT No.: PCT/FR03/03064

§ 371 (c)(1),
(2), (4) Date: Mar. 27, 2006

(87) PCT Pub. No.: WO2004/036753

PCT Pub. Date: Apr. 29, 2004

(65) Prior Publication Data

US 2006/0187894 A1    Aug. 24, 2006

(30) Foreign Application Priority Data

Oct. 17, 2002   (FR) .................................. 02 12900

(51) Int. Cl.
  H03D 3/24       (2006.01)
(52) U.S. Cl. ...................................................... 375/376
(58) Field of Classification Search ................ 375/373, 375/374, 375, 376
See application file for complete search history.

(56) References Cited

U.S. PATENT DOCUMENTS

| | | | | |
|---|---|---|---|---|
| 4,096,360 A | * | 6/1978 | Takahashi et al. | 369/47.16 |
| 4,231,094 A | * | 10/1980 | Desblache | 375/281 |
| 4,287,480 A | * | 9/1981 | Swift et al. | 331/1 A |
| 4,803,407 A | * | 2/1989 | Mehrgardt | 315/364 |
| 4,849,991 A | | 7/1989 | Arnold et al. | |
| 5,450,452 A | * | 9/1995 | Kakuishi et al. | 375/376 |
| 5,502,711 A | * | 3/1996 | Clark et al. | 369/59.17 |
| 5,987,078 A | * | 11/1999 | Kiyanagi et al. | 375/344 |
| 6,067,363 A | * | 5/2000 | Dent | 381/113 |

(Continued)

OTHER PUBLICATIONS

Preliminary Search Report for French Appl. No. 0212900 dated Jun. 16, 2003.

*Primary Examiner*—Chieh M Fan
*Assistant Examiner*—Jaison Joseph
(74) *Attorney, Agent, or Firm*—Lisa K. Jorgenson; Jose Gutman; Fleit Gibbons Gutman Bongini & Bianco P.L.

(57) ABSTRACT

A method for estimating the phase in a digital communication system, comprising the steps of:
  receiving and storing a block of observations $Y_k$;
  executing at least one phase locked loop (PLL) on a predetermined sequence of observations extracted from said block.

Each PLL provides an intermediate value, combining both intermediate values makes it possible to provide a sharpened phase estimate. The method allows realization of an improved phase estimator based on the simplicity of phase locked loops.

8 Claims, 4 Drawing Sheets

U.S. PATENT DOCUMENTS

| | | | |
|---|---|---|---|
| 6,356,129 B1 * | 3/2002 | O'Brien et al. | 327/175 |
| 6,628,276 B1 * | 9/2003 | Elliott | 345/213 |
| 7,099,382 B2 * | 8/2006 | Aronson et al. | 375/219 |
| 7,443,922 B1 * | 10/2008 | Venkata et al. | 375/295 |
| 2001/0043102 A1 | 11/2001 | Kuge | |
| 2005/0254601 A1 * | 11/2005 | Liu et al. | 375/326 |
| 2006/0280092 A1 * | 12/2006 | Tonami | 369/59.21 |

* cited by examiner

PHASE ESTIMATION METHOD IN A DIGITAL AND PHASE LOCKED LOOP COMMUNICATION SYSTEM

TECHNICAL FIELD

The present invention relates to the field of digital communications, and in particular to a method for estimating the phase in a digital communication system and to a phase-locked loop.

BACKGROUND OF THE INVENTION

In a digital communication system comprising a transmitter and a receiver, a digital signal to be transmitted—usually a succession of symbols—is converted, before transmission, into a continuous-time analog signal, which is then transmitted through a physical propagation medium, air or any other physical propagation environment. When the signal is received by the receiver, it is then processed and converted into digital form by means of appropriate sampling, which is typically carried out at a frequency $f_e$ that should be synchronous to symbol emission frequency $f_s$. Unfortunately, the clocks situated in the oscillating circuits equipping the transmitter and the receiver are never synchronous and it is then necessary to compensate for any frequency drift between these clocks, in order to be able to correctly process the received signal and to extract emitted symbols.

Such frequency shift affecting oscillators at transmission and reception generates a parasitic phase shift in the output signal of the complex demodulator located in the receiver. Other factors contribute to accentuate this parasitic phase shift. First, there is the time needed by digital signals to flow through a propagation medium. Secondly, any movement of the transmitter relative to the receiver generates Doppler beat and tends to introduce further disruptive phase shift.

Referring to a baseband model, observations $Y_k$ at the output of the complex demodulator located in the receiver can be expressed by the following formula:

$$Y_k = a_k e^{j\xi_k} + \eta_k$$

where $a_k$ corresponds to emitted symbols, $\xi_k$ is the parasitic phase shift and $\eta_K$ is additional noise.

Techniques are already known—based on phase estimator circuits—to estimate this parasitic phase shift $\xi_K$ and correct it.

The most sophisticated phase estimators, which process simultaneously whole sets of received observations, are based on extremely cumbersome digital processing: particulate filtering, random-walk methods with Markov chain, etc. In practice, implementing such techniques proves to be unrealizable due to the considerable computing power required.

For this reason, the complexity of phase estimators is opposed to the simple implementation of phase-locked loops that sequentially process received observations one after the other instead of processing whole sets of received observations. Typically, a phase locked loop (PLL) is based on an iterative digital algorithm for estimating a phase estimate. Whereas traditionally, phase-locked loops were carried out by means of analog circuits, now such processing is purely digital. It should be noted that this digital processing depends closely on the type of modulation considered.

As an example, let us consider the case of a binary phase shift keying (BPSK) modulation. In such BPSK modulation, transmitted symbols $a_k$ are equal to $-1$ or $+1$. Because of the previously mentioned parasitic phase shift, one doesn't obtain $-1$ nor $+1$ at the output of the complex demodulator, but these values modified by a phase shift. A well-known PLL for correcting such phase shift is the one known as Costa's loop that relies on the use of a gradient algorithm, associated with a cost function J given by the following formula:

$$J(\phi) = E(|y^2_k e^{-i2\phi} - 1|^2)$$

where E is the Expectation operator.

Applying the gradient algorithm to variable $\phi$ makes it possible to make the algorithm converge towards a phase estimate:

$$\phi_k = \phi_{k-1} - \gamma \partial J(\phi)/\partial \phi |\phi = \phi_{k-1}$$

A Costa's loop is finally obtained by removing the expectation: it is the stochastic gradient algorithm minimizing cost function J.

Other formulas are known for other types of modulation and in particular squaring modulation, also known as four-state Quadrature Amplitude Modulation or 4-QAM. Generally, whatever the type of modulation employed, phase-locked loops are built according to a general formula of the type:

$$\phi_k = \phi_{k-1} - \gamma F(Y_k, \phi_{k-1})$$

where F is a function depending closely on the considered modulation.

Typically, as can be seen from the preceding formula, all loops consist in calculating a phase $\phi_k$ according to the preceding element $\phi_{k-1}$ and a function F of both elements $Y_k$ and $\phi_{k-1}$. It should be noted that, in this formula, according to the type of phase shift to be corrected, sophisticated correction of the parameter $\gamma$ can be used, and in particular a corrective second-order filter (proportional integral), or even a higher order filter, could be used.

All known phase-locked loops—conventionally adopting the known analog model—present the same limitation. The evaluation of phase $\phi_K$ is primarily based on the preceding phase value $\phi_{k-1}$ and on a function of one or more previous observations. Hence, an imperfect estimation of the phase and, consequently, correction thereof.

It is advisable to improve the phase locked loop (PLL) model in order to increase precision of the estimate and effectiveness of the correction process.

DISCLOSURE OF THE INVENTION

An object of the present invention is a new phase locked loop (PLL) structure making it possible to increase phase estimate precision compared to a conventional loop.

Another object of the invention is to provide a phase estimation process for a digital receiver, which is perfectly adapted for processing a digital signal in a receiver equipped with an error corrective system.

According to the invention, these objects are reached by means of a phase estimation method and a phase locked loop (PLL) device.

The invention provides a phase estimation method in a digital communication system comprising:
  receiving and storing a block of observations $Y_k$;
  executing at least one phase locked loop (PLL) on a predetermined sequence of observations extracted from said block.

The invention also provides a phase locked loop (PLL) device for a digital receiver including:
  means to receive and store blocks of observations;
  a first phase locked loop (PLL) for generating a first intermediate value;

a second phase locked loop (PLL) for generating a second intermediate value;

means to derive a phase estimate from said first and second intermediate values.

Using block processing at a phase locked loop (PLL)—whereas block processing usually takes place after the loop, at the level of error correcting codes—allows great improvement of the phase estimation process while preserving the very simple implementation of traditional phase-locked loops.

In particular, the chronological link between observations and the iterative algorithm implemented by PLL can be broken. The invention consists in associating two a priori paradoxical concepts, namely block processing and phase locked loop. In conventional approach, a phase loop is considered as an iterative processing, based on previous observations from which a phase estimate at a given moment is derived. The present invention goes beyond this approach and provides a process in which, after an observation block is stored, phase can be estimated from one or more PLLs, based on any sequence of observations within this block.

Preferably, a first phase locked loop (PLL) executing on a first set of observations of said block and a second phase locked loop (PLL) executing on another sequence of observations extracted from said block are realized. The results of both loops are then combined to provide a sharpened phase estimate at each sampling time.

Clearly, combining block processing with the simplicity of phase-locked loops allows great improvement of the phase estimation precision and, consequently, the phase correction. Indeed, with block processing previous observations as well as later observations within a block are taken into account for calculating $\phi_K$. Hence a significant improvement of the phase locked loop (PLL) precision.

Although this process introduces a processing delay related to the storing of a whole block of observations before phase estimation for each observation $Y_k$, this delay is not prejudicial and is perfectly adapted to the use of some error correcting codes, like turbo-codes or block codes.

Preferably, block processing will be realized by means of a first phase locked loop operating in the chronological direction of the observations, and of a second phase locked loop operating in opposite direction.

In a preferred embodiment, the second phase locked loop (PLL) is initialized to the value provided by the first loop at the end of iteration.

DESCRIPTION OF THE DRAWINGS

Other features, objects and advantages of the invention will appear when reading the following description and drawings, only given by way of nonrestrictive examples, where.

DESCRIPTION OF A PREFERRED EMBODIMENT

Figure 1:
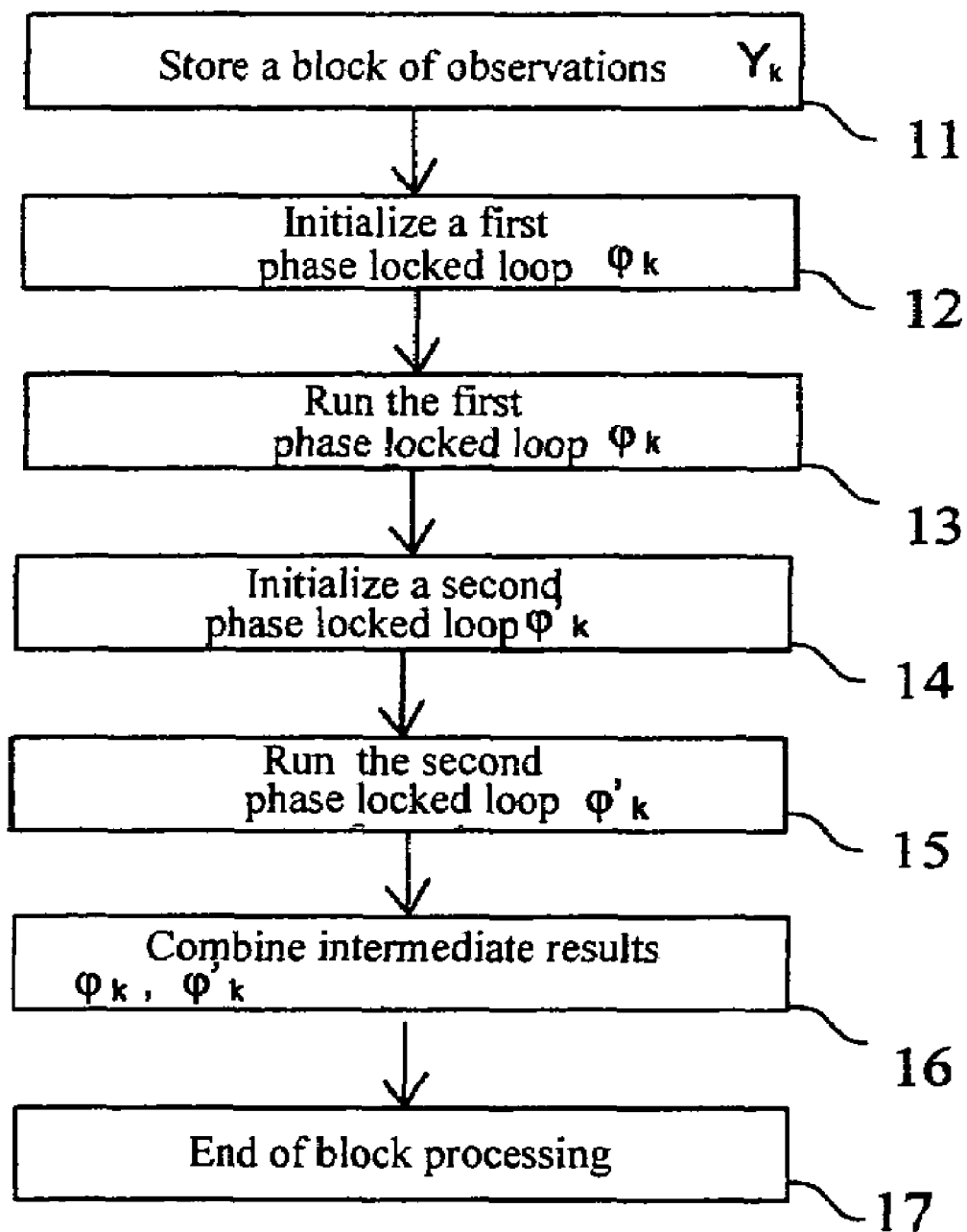
FIG. 1 illustrates a flowchart of a phase estimation process according to the invention.
Figure 2:
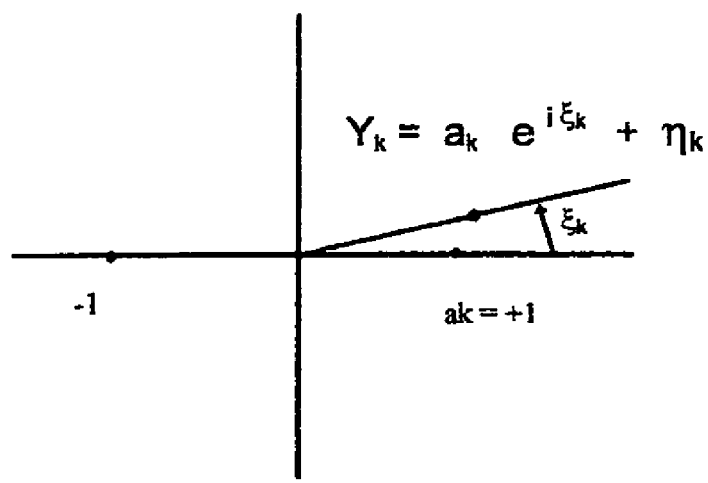
FIG. 2 illustrates the effect of a phase shift for a BPSK modulation.

Referring to FIG. 1, a general phase estimation process is described, which is appropriate for any type of modulation, BPSK, 4-QAM, etc. The process comprises a first step 11 where a set of n+1 observations ($Y_0$ to $Y_n$) outputted from a complex demodulator is received and stored within a block of n+1 observations. Typically, a block of about 1,000 to 10,000 observations could be considered, and persons qualified in the art will choose such number according to the application and the type of modulation considered.

After storing the block, a first phase locked loop (PLL) is realized, which will execute on a predetermined sequence of block observations. Typically, any sequence could be considered and more particularly a chronological sequence of observations $Y_k$, according to data reception order. Realizing a phase locked loop (PLL) is not particularly difficult and, for clarity's sake, will not be further developed. It is sufficient to say that, depending on the type of modulation used, an iterative algorithm according to the previously mentioned general formula is used.

$$\phi_K = \phi_{k-1} - F(Y_k, \phi_{k-1}) \text{ with } k=1 \text{ to } n$$

In step 12, a first phase locked loop is initialized. Typically, this initialization makes it possible to set the first values of the iterative algorithm, and in particular the first value $\phi_0$. Preferably, when the phase is continuous from one block to the other, the first loop will be advantageously initialized by taking into account the last estimate from the preceding block. For a loop having an order higher than 1 several parameters will have to be set and, again, any useful continuity could advantageously be used.

Figure 3:
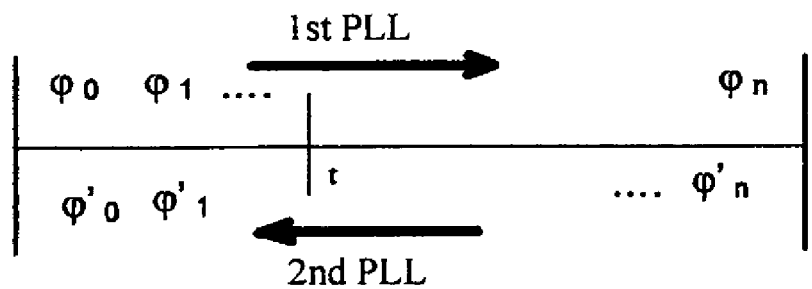
FIG. 3 illustrates a preferred embodiment based on the use of two PLLs operating in opposite directions.

In step 13, the first phase locked loop (PLL) is executed in order to build sequence $\phi_0, \phi_1, \phi_2, \phi_3 \ldots \phi_N$, as illustrated in FIG. 3 by the arrow pointing right.

In step 14, a second phase locked loop (PLL) executing in opposite direction from the first PLL (as shown in FIG. 3 by a right-to-left arrow). Preferably, the first value of the second loop, namely $\phi'_N$, is initialized to the last digital value ($\phi_N$ calculated by the first phase-locked loop.

In step 15, the second phase locked loop (PLL) is executed in order to build sequence $\phi'_{n-1}, \phi'_{n-2}, \ldots \phi'_2, \phi'_1, \phi'_0$ calculated in reverse direction compared to previously.

$$\phi'_k = \phi'_{k+1} - \gamma F(Y_k, \phi'_{k+1}) \text{ with } k=n-1 \text{ to } 0$$

In step 16, intermediate results produced by the first and the second phase locked loops are combined in order to produce phase estimate $\phi''_k$ according to the following formula:

$$\phi''_k = G(\phi_k, \phi'_k)$$

where function G is adapted to the type of modulation considered. In a particular embodiment, G is chosen so as to generate a weighted total in the form:

$$\phi''_k = A \times \phi_k + B \times \phi'_k$$

Preferably, variable coefficients $A_k$ and $B_k$ could be chosen in order to give more importance to one of the phase-locked loops according to k. Indeed, the weights of the weighted total can be chosen in order to give more importance to the first loop in the right-hand part of the block of FIG. 3 and conversely, to add more weight to the second loop in the left-hand part of the block. Thus, the loop having performed the most iterations is always given more importance and will reach a higher degree of accuracy in phase calculation.

Figure 4:
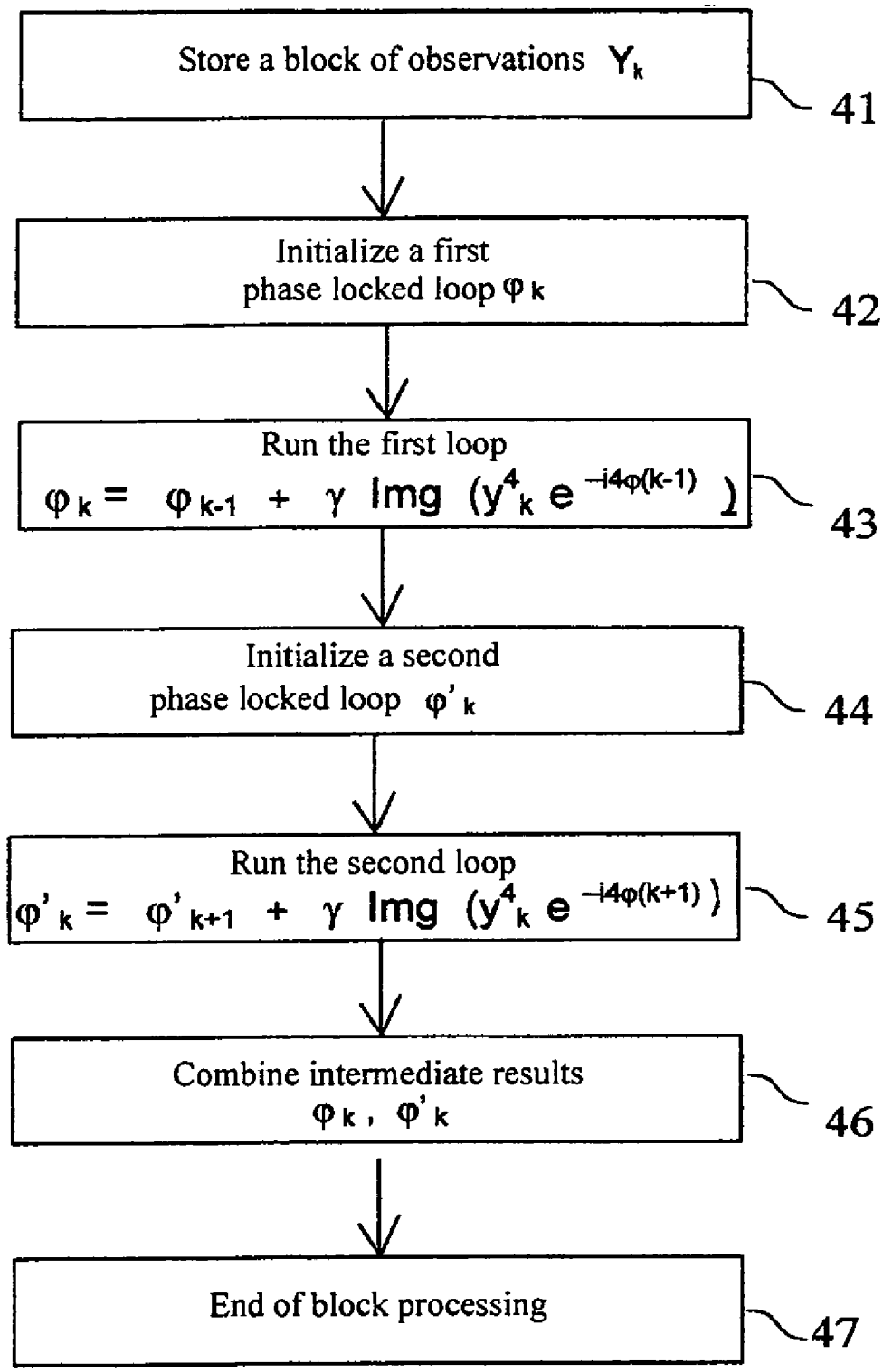
FIG. 4 illustrates the application of the process of FIG. 1 to a 4-PSK or 4-QAM modulation.

Referring to FIG. 4, application of the general process of FIG. 1 to a 4-BPSK or 4-QAM-type modulation is now described. In this type of modulation, complex symbols $a_k$, which are respectively −1, +1, −i and +i, are transmitted. The process begins at step 41 that consists in receiving and storing a block of observations received from the complex demodulator, like previously.

In step 42, the first phase locked loop (PLL) adapted for a 4-QAM modulation is initialized:

$$\phi_K = \phi_{k-1} + \gamma Img(y^4_k e^{-i4\phi(k-1)})$$

where Img corresponds to the imaginary part of the complex number.

It should be noted that, in practice, using a sophisticated digital filter could be considered for calculating factor γ according to the phase shift model to be corrected. For simple phase shifts, a simple proportional corrector could be enough whereas in more complex cases, it would be advantageous to use an integral corrector, or even a high-order filter.

For phase locked loop initialization, the first value $\phi_0$ is given. Preferably, parameter γ will be realized by means of a second-order digital filter, for example a second-order filter according to the following formula:

$$\gamma = \gamma_1 + \gamma_2/(1+z^{-1})$$

and it will be initialized while taking into account all usable continuity factors.

In step 43, the first phase locked loop (PLL) is executed in order to build sequence $\phi_0, \phi_1, \phi_2, \phi_3 \ldots \phi_N$.

In step 44, a second Costa's PLL is now initialized to the last value calculated by the first loop and, in step 45 said second loop is executed to build the sequence $\phi'_{n-1}, \phi'_{n-2}, \ldots \phi'_2, \phi'_1, \phi'_0$ calculated in the opposite direction.

$$\phi'_k = \phi'_{k+1} + \gamma Img(y_k^4 e^{-i4\phi(k+1)}) \quad k=n-1 \ldots 0$$

These intermediate results are then combined at step 46 to generate the phase shift estimate $\phi''_K$, preferably according to the formula:

$$\phi''_K = G(\phi_K, \phi'_K)$$

In step 47, processing of the current block is completed.

Figure 5:
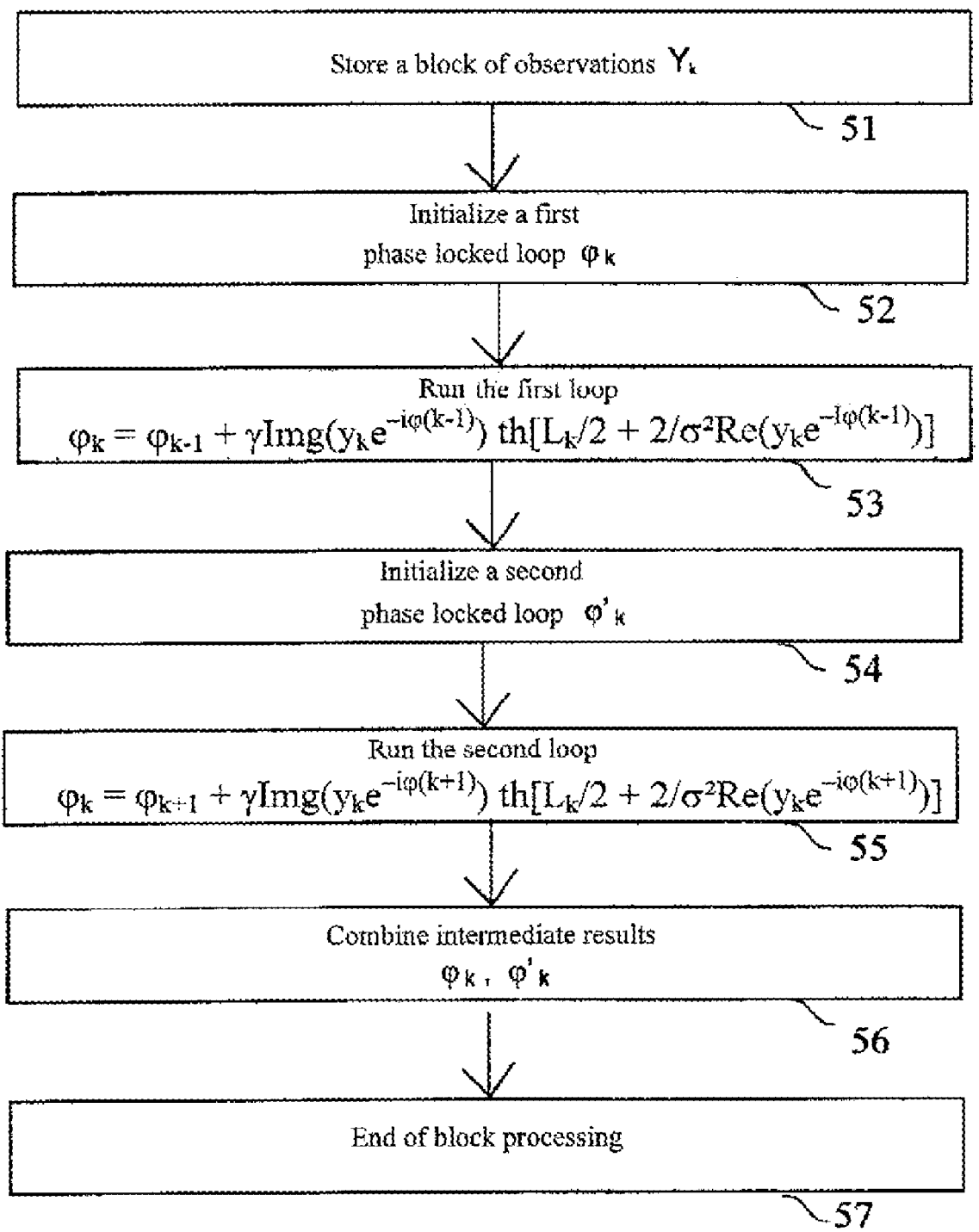
FIG. 5 illustrates the application of the invention to a two-state BPSK-type modulation.

To illustrate the general nature of the invention, with reference to FIG. 5, we will now show how the invention can contribute to considerably improve phase estimation in a BPSK modulation.

Again, the process starts with the reception and storing a block of observations $Y_k$, step 51.

In step 52, the first phase locked loop (PLL) adapted for a BPSK modulation is initialized. In a new and particularly advantageous way, the first PLL is combined with the use of statistical data related to symbols $a_k$ transmitted in this BPSK modulation. To this end, a PLL according to the following formula is realized:

$$\phi_k = \phi_{k-1} + \gamma Img(y_k e^{-i\phi(k-1)}) th[L_k/2 + 2/\sigma^2 Re(y_k e^{-i\phi(k-1)})]$$

where:
th is the hyperbolic tangent operator,
Re is the operator of the real part of a complex number,
$\sigma^2$ is the noise variance;
and $L_k = Ln[p(a_k=1)/p(a_k=-1)]$,
Ln is the natural logarithm,
$p(a_k=1)$ is the probability that symbol $a_k$ is equal to +1, and $p(a_k=-1)$ is the probability that symbol $a_k$ is equal to −1.

As previously, it would be possible to use a second-order digital filter—even a higher order filter—for factor γ.

In step 53, the first phase locked loop (PLL) is executed in order to build sequence $\phi_0, \phi_1, \phi_2, \phi_3 \ldots \phi_n$.

In step 54, a second phase locked loop (PLL) built like previously is now initialized to the last value calculated by the first loop and, while taking into account statistical data related to symbols. In step 55, this loop is executed to build sequence $\phi'_{n-1}, \phi'_{n-2}, \ldots \phi'_2, \phi'_1, \phi'_0$ calculated in the opposite direction as compared to previously.

Two alternative embodiments are still possible. If noise power stays low, the hyperbolic tangent function can be approximated using a signum function. The following formula is then obtained, which is typical of a decision feedback loop, within the term $L_k/2$.

$$\phi_k = \phi_{k+1} + \gamma Img(y_k e^{-i\phi(k+1)}) th[L_k/2 + 2/\sigma^2 Re(y_k e^{-i\phi(k+1)})]$$

On the other hand when noise power is high, it can be noted that the hyperbolic operator tangent can be approximated with an identity function, which comes back to a Costa's loop formula (to within addend $L_k/2$).

In step 56, intermediate results obtained from both phase-locked loops are combined to generate the phase shift estimate $\phi''_K$, preferably according to the formula:

$$\phi''_K = G(\phi_K, \phi'_K)$$

As previously, processing of the current block is completed in step 57.

Both preceding examples show that the process according to the invention applies to any type of modulation and any type of phase locked loop (PLL). Clearly, persons qualified in the art could readily realize all appropriate adaptations, and even advantageously combine a very early phase locked loop block processing with any subsequent later processing, such as error correcting codes, turbo-codes, etc.

The invention claimed is:

1. A method for estimating the phase in a digital communication system comprising the steps of:
   receiving and storing a block of observations $Y_k$; and
   executing at least more than one phase locked loop (PLL) on a predetermined sequence of observations from said block;
   executing a first PLL on said observations according to their chronological order of occurrence in order to generate a first intermediate value;
   executing a second PLL on said observations according to their inverse chronological order of occurrence in order to generate a second intermediate value; and
   combining said first and second intermediate values to generate a phase estimate.

2. A method for estimating the phase in a digital communication system, comprising the steps of:
   receiving and storing a block of observations $Y_k$:
   executing at least one phase locked loop (PLL) on a predetermined sequence of observations from said block:
   executing a first PLL on said observations in order to generate a first intermediate value;
   executing a second PLL on said observations in order to generate a second intermediate value; and
   combining said first and second intermediate values to generate a phase estimate,
   characterized in that said first PLL executes on a sequence of observations according to their chronological order of occurrence, and that said second loop executes on the inverse sequence.

3. The method according to claim 2 characterized in that said second PLL is initialized to the last value calculated by said first PLL.

4. A method for estimating the phase in a digital communication system, comprising the steps of:
   receiving and storing a block of observations $Y_k$ of an output signal from a complex demodulator, with k varying from 0 to n;
   initializing a first phase locked loop (PLL) from received observations $Y_k$;
   executing said first PLL according to the following formula: $\phi_k = \phi_{k-1} - \gamma F(Y_k, \phi_{k-1})$ with k=1 to n, where F is a function adapted to the type of modulation considered, where $\phi$ is a phase of an observation of the output signal from the complex demodulator, and where $\gamma$ is realized by means of a second-order digital filter according to the formula $\gamma=\gamma_1+\gamma_2/(1+z^{-1})$;

initializing a second PLL from observations $Y_k$, with k varying from n to 0;

executing said second PLL according to the following formula: $\phi'_k=\phi'_{k+1}-\gamma F(Y_k,\phi'_{k+1})$ with k=n−1 to 0; and combining the results produced by said first and second loops to generate a phase estimate.

5. A method according to claim 4, characterized in that the modulation is a binary phase shift keying (BPSK) modulation with a phase locked loop (PLL) defined by $$\phi_k=\phi_{k-1}+\gamma Img(y_k e^{-i\phi(k-1)})th[L_k/2+2/\sigma^2 Re(y_k e^{-I\phi(k-1)})],$$
where:

th is the hyperbolic tangent operator,

Re is the operator referring to the real part of a complex number, $\sigma^2$ is the noise variance, $L_k$=Ln $[p(a_k=1)/p(a_k=-1)]$, Ln is the natural logarithm, $p(a_k=1)$ is the probability that symbol $a_k$ is equal to +1, and $p(a_k=-1)$ is the probability that symbol $a_k$ is equal to −1.

6. The method according to claim 5 characterized in that said factor $\gamma$ is realized by means of a second or higher order digital filter.

7. A phase locked loop device for a digital receiver for receiving a signal having a type of modulation, comprising:

means to receive and store blocks of observations;

a first phase locked loop (PLL) for generating a first intermediate value;

a second phase locked loop (PLL) for generating a second intermediate value; and means to derive a phase estimate from said first and second intermediate values, characterized in that said first and second phase locked loops are realized according to the following formula:

$$\phi_k=\phi_{k-1}-\gamma F(Y_k,\phi_{k-1}) \text{ with } k=1 \text{ to } n$$

or $$\phi'_k=\phi'_{k+1}-\gamma F(Y_k,\phi'_{k+1}) \text{ with } k=n-1 \text{ to } 0,$$

where F is a function adapted to the type of modulation received,

Y is an observation of an output signal from a complex demodulator, $\phi$ is a phase of an observation of the output signal from the complex demodulator, and $\gamma$ is realized by means of a second-order digital filter according to the formula $\gamma=\gamma_1+\gamma_2/1+z^{-1})$.

8. The device according to claim 7 characterized in that the first value calculated by said second loop is determined by the last calculation made by said first phase locked loop.

* * * * *

UNITED STATES PATENT AND TRADEMARK OFFICE
CERTIFICATE OF CORRECTION

PATENT NO. : 7,660,378 B2 Page 1 of 1
APPLICATION NO. : 10/531674
DATED : February 9, 2010
INVENTOR(S) : Jean-Marc Brossier et al.

It is certified that error appears in the above-identified patent and that said Letters Patent is hereby corrected as shown below:

In Abstract section on Title Page of patent from
"A method for estimating the phase in a digital communication
system, compromising the steps of:
receiving and storing a block of observations Ysubk;
executing at least one phase locked loop (PLL) on a
predetermined sequence of observations extracted from
said block.
Each PLL provides an intermediate value, combining both
intermediate values makes it possible to provide a sharpened
phase estimate. The method allows realization of an improved
phase estimator based on the simplicity of phase locked loops."
-- To --
"A method for estimating the phase in a digital communication system,
compromising the steps of: receiving and storing a block of observations Ysubk;
executing at least one phase locked loop (PLL) on a pre-determined sequence of
observations extracted from said block. Each PLL provides an intermediate value,
combining both intermediate values makes it possible to provide a sharpened phase
estimate. The method allows realization of an improved phase estimator based on
the simplicity of phase locked loops."

Signed and Sealed this

Thirteenth Day of April, 2010

David J. Kappos
*Director of the United States Patent and Trademark Office*